United States Patent [19]
Okamura

[11] Patent Number: 5,739,703
[45] Date of Patent: Apr. 14, 1998

[54] BICMOS LOGIC GATE

[75] Inventor: Hitoshi Okamura, Tokyo, Japan

[73] Assignee: NEC Corporation, Tokyo, Japan

[21] Appl. No.: 613,881

[22] Filed: Mar. 11, 1996

[30] Foreign Application Priority Data

Mar. 10, 1995 [JP] Japan ................... 7-079844

[51] Int. Cl.$^6$ .................. H03K 19/082; H03K 19/094
[52] U.S. Cl. .................. 326/110; 327/207; 326/115
[58] Field of Search ................ 326/110, 109, 326/84, 115, 76, 64, 66; 327/202, 207, 218

[56] References Cited

U.S. PATENT DOCUMENTS

| | | | |
|---|---|---|---|
| 4,645,951 | 2/1987 | Uragami | 326/84 |
| 4,808,851 | 2/1989 | Chantepie . | |
| 5,006,730 | 4/1991 | Davis | 326/115 |
| 5,124,588 | 6/1992 | Baltus et al. . | |
| 5,144,164 | 9/1992 | Sugimoto et al. | 326/109 |
| 5,149,992 | 9/1992 | Allstot et al. . | |
| 5,214,317 | 5/1993 | Nguyen | 326/66 |
| 5,216,295 | 6/1993 | Hoang | 326/115 |
| 5,306,964 | 4/1994 | Taylor | 326/110 |
| 5,329,182 | 7/1994 | Yu . | |
| 5,420,529 | 5/1995 | Guay et al. | 326/115 |

FOREIGN PATENT DOCUMENTS

| | | |
|---|---|---|
| 6-291616 | 10/1994 | Japan . |
| 6-509215 | 10/1994 | Japan . |
| 6-83049 | 10/1994 | Japan . |
| 7-264056 | 3/1995 | Japan . |

*Primary Examiner*—Edward P. Westin
*Assistant Examiner*—Richard Roseen
*Attorney, Agent, or Firm*—Sughrue, Mion, Zinn, Macpeak & Seas, PLLC

[57] ABSTRACT

In order to provide a high speed, stable and low voltage swing logic gate highly applicable to a low-cost BiCMOS process, a BiCMOS logic circuit of the disclosed invention has a pair of MOS transistors, the gates of which are supplied with complementary logic input signals, and the sources of which are coupled together and are supplied with a constant current. The constant current source used may include a bipolar transistor controlled by a reference voltage. Additionally, the constant current source may be a current mirror. The BiCMOS logic circuit of the disclosed invention has a complementary logic output signal. The voltage swing of the complementary logic output signal are determined by the reference voltage and resistance ratio of resistors in the circuit, so that the output voltage swing is independent of power supply fluctuation or temperature change.

20 Claims, 11 Drawing Sheets

BICMOS LOGIC GATE

BACKGROUND OF THE INVENTION

This invention relates to a semiconductor integrated circuit, and more particularly to logic circuitry on the basis of a BiCMOS technology wherein bipolar transistors and MOS transistors are integrated on a common semiconductor substrate.

FIG. 12 is a circuit diagram of a buffer/inverter of a conventional ECL (Emitter Coupled Logic) gate, comprising, a first and a second NPN bipolar transistor 69 and 70 (NPN bipolar transistors are hereafter abbreviated to NPN transistors) composing a pair of differentially operating transistors of which emitters are coupled with each other and bases are connected to an input terminal 81 and a reference voltage supply VREF respectively, a first and a second resistors 71 and 72 connecting collectors of the NPN transistors 69, 70 respectively to a positive power supply GNE, (grounded), a third NPN transistor 73 with its collector connected to emitters of the NPN transistors 69, 70 and with its base connected to a constant voltage supply VCS, a third resistor 74 connecting emitter of the NPN transistor 73 to a negative power supply VEE, a fourth and a fifth NPN transistors 75 and 76 of which both collectors are connected to GND, bases are connected to collectors of the first and the second NPN transistors 69, 70 respectively and emitters connected to a first and a second output terminals 79 and 80 respectively and terminal resistors 77 and 78 connecting the first and the second output terminals 79, 80 respectively to an termination power supply VT.

Now, R1 being the resistance of both the first and the second resistors 71 and 72, and R2 being the resistance of the third resistor 74, operation of the ECL gate of FIG. 12 is described.

When logic of an input signal supplied to the input terminal 81 turns to logic HIGH and its base potential becomes higher than the reference voltage supply VREF, the first NPN transistor 69 becomes ON and a potential drop V is generated by the first resistor 71, while the second NPN transistor becomes OFF simultaneously.

Collector current I of the third NPN transistor 73 is expressed as;

$$I = (Vcs - Vf)/R2, \quad (1)$$

where Vf is a forward base-emitter bias of the third NPN transistor 73, and Vcs is a voltage difference between the constant voltage supply VCS and the negative power supply VEE. The equation (1) shows that the collector current I has a constant value determined by the voltage difference Vcs, the forward base-emitter bias Vf of the third NPN transistor 73 and the resistance R2 of the third resistor 74.

Since collector current of the first NPN transistor 69 equals the collector current I of the third NPN transistor 73, the potential drop V generated by the first resistor 71 is expressed as;

$$V = (Vcs - Vf)(R1/R2). \quad (2)$$

Therefore, GND potential defined as 0V, output potential Vout1 of the first output terminal 79 is given by a following equation (3), when base-emitter bias of the fourth NPN transistor 75 is Vf, too;

$$Vout1 = -(Vcs - Vf)(R1/R2) - Vf, \quad (3)$$

while output potential Vout2 of the second output terminal 80 is as follows, Vf being forward base-emitter bias of the fifth NPN transistor 76, too.

$$Vout2 = -Vf \quad (4)$$

The output potential alterations are implemented at high speed by the fourth and the fifth NPN transistors 75 and 76.

Factors affecting the switching speed of the ECL gate will be described referring to a schematic diagram of FIG. 13 illustrating equivalent capacitances incidental to each node of the ECL gate. C1 and C3 represent a base-collector capacitance and a base-emitter capacitance respectively, with C3 being a collector capacitance to the semiconductor substrate.

When the first NPN transistor is turned to ON by a rise of base potential, collector potential drops, and charges of C1, C2 and C3 are changed. To the operating speed of the circuitry, the base-collector capacitance C1 is about two times as affecting as the collector-substrate capacitance C3, because the potential of each electrode of the base-collector capacitance is shifted to opposite side with each other.

As for the base-emitter capacitance C3, it affects little since the emitter potential follows the base potential after the first NPN transistor 69 is turned to ON.

In an ordinary NPN transistor with an emitter size of $0.6 \times 1.8$ μm$^2$, each value of the capacitances C1, C2 and C3 is about 12 fF, 27 fF and 7 fF respectively, which can be reduced to about 2.5 fF, 8 fF and 3fF in a NPN transistor of the same emitter size when prepared by a base-emitter self-alignment process and a trench element separation process.

According to a simulation result of basic delay times of these two, kinds of devices applied in an ECL gate (of 1 fan-out with no wire length), there is observed a certain difference between them, that is, 70 ps in the former device and 30 ps in the latter device, although these two devices both have their cutoff frequencies fT between 15 GHz and 20 GHz.

This difference of delay time is considered to be caused especially by the difference of the two incidental capacitances, namely a base-collector capacitance C1 and a collector-substrate capacitance C3, between the two devices.

As above described, the incidental capacitance is a great factor affecting the switching speed of the ECL gate.

In-out transfer characteristic of the ECL gate is shown in FIG. 14.

With a high mutual conductance gin, the ECL gate has a very narrow dynamic range of about 100 mV. Therefore, when a logic signal of an amplitude of 600 mV is input, its fluctuation is not directly reflected to the output level because it equals that a margin of 500 mV is reserved for buffering the input fluctuation.

Now, power supply voltage necessary for implementing the ECL gate is described.

High level of the logic signal input to an ECL gate is determined by the forward base-emitter bias Vf of NPN transistors 75, 76 constituting preceding emitter followers, as −900 mV for example. So, reference potential Vref of the reference potential supply VREF is preferably to be set −1200 mV when amplitude of the input logic signal is 600 mV. And, minimum potential level of coupled emitters of the first and the second NPN transistors 69, 70 is introduced as −2100 mV from the reference potential Vref subtracting the forward base-emitter bias Vf=900 mV therefrom.

Therefore, a minimum power supply voltage for an ECL gate non-cascaded is calculated as 2.7V when, in order not to saturate the second NPN transistor 73 supplying a constant current, collector-emitter voltage Vce of the second NPN transistor 73 and a potential difference between ends of the third resistor 74 are both set to 300 mV.

When two ECL gates are cascade-connected, input signal level for the lower pair of NPN transistors should be lower by a forward base-emitter bias Vf than that for the upper pair of NPN transistors. So, a minimum power supply voltage of 3.6V is needed, which is added with. 0.9 V by each additional ECL gate cascaded.

FIG. 15 is a circuit diagram of a conventional CML (Current Mode Logic) gate, where emitter followers of the ECL gate are eliminated and output logic signals are taken out directly from nodes 82 and 83, that is, collectors of the first and the second NPN transistors 69 and 70 of the ECL gate of FIG. 12. Therefore, it has a defect that switching speed becomes remarkably slow with a heavy output load, but there is a merit on the other hand that it can be implemented with a power supply voltage lower by a forward base-emitter bias Vf than the ECL gate since output logic signals are not biased thereby.

Now, a conventional MCML (MOS current mode logic) gate is described in connection with a circuit diagram illustrated in FIG. 16.

Some embodiments of the MCML gate are proposed in Japanese patent applications laid open as provisional publications No. 292616/'94 and No. 264056/'95. Referring to FIG. 16, a differential pair of nMOS transistors 84 and 85 are supplied with a constant current from drain of a nMOS transistor 88 gated by a constant voltage supply VCS, and change their ON/OFF status complementally controlled by a pair of input complementary logic signals, outputting complementary logic signals generated between ends of resistors 86 and 87 connecting the differential pair of nMOS transistors 84 and 85 to a positive power supply GND.

In a conventional MCML gate as shown in FIG. 16, the current stability depends on the nMOS transistor 88, and is susceptible to its threshold voltage Vth or to its operating temperature. So, there is a problem that output amplitude fluctuates however accurately the constant voltage supply VCS is maintained.

Another problem of the MCML gate is that logic circuits may not function when the logic circuits are designed with a series of a large number of MCML gates because of amplitude attenuation, since very low mutual conductance gm of MOS transistors makes voltage gain of a MCML gate near 1.

Furthermore, the MCML gate drives its output load with voltage differences generated by drain currents of the MOS transistors 84 and 85, which equal the constant current, between ends of the resistors 86 or 87, therefore, its operating speed is sharply reduced when there are many fanouts or large wiring capacitance.

As described heretofore, for a conventional ECL gate, of which operating speed greatly depends on incidental capacitances as well as the cutoff frequency fT of its NPN transistors, high cost processes as a base-emitter self-alignment process and a trench element separation process are indispensable. In other words, no ECL gate predominant in its speed to sub-micron-processed CMOS gates is materialized by simple and low-cost processes as a bipolar process.

Still more, power supply voltage reduction is also difficult in ECL, gates because of necessity of sufficient collector-emitter voltage to avoid current saturation in addition to incompressibility of the forward base-emitter bias.

On the other hand, having a merit as for the power supply voltage reduction without emitter follower, the conventional CML gate is inferior in its output-driving capacity and has a problem of a remarkable slowdown with a load of fanouts or wiring capacitances.

As for the MCML gate, it is still inferior in point of stability to ECL gates or CML gates because of no sufficient constant current source is realized, and for having a low output-driving capacity.

SUMMARY OF THE INVENTION

Therefore, a primary object of the present invention is to overcome these problems of the prior arts above described and to realize a logic gate of high applicability fabricated by a low-cost BiCMOS process, which can be implemented stably at high speed with a low power supply voltage.

In order to achieve the object, a BiCMOS logic gate of an embodiment of the present invention comprises:

a pair of MOS transistors, each source of said pair of MOS transistors coupled with each other, and each gate of said pair of MOS transistors supplied with each of input complementary logic signals;

a constant current source connected between a connection of said each source coupled and a first terminal of a power supply, said constant current source including a bipolar transistor with a base controlled by a reference voltage; and a pair of load elements, each of said pair of load elements connected between each drain of said pair of MOS transistors and a second terminal of said power supply, and each of voltage differences generated by said pair of load elements being output as each of output complementary logic signals.

And in the BiCMOS logic gate:

an emitter of said bipolar transistor is connected to said first terminal of said power supply through a resistor; and said each of voltage differences generated by said pair of load elements is determined by a ratio of a resistance of said load elements to a resistance of said resistor and said reference voltage.

Therefore, a BiCMOS logic gate extremely stable against the power supply fluctuation, the temperature change and the fabrication process deviation is provided in the embodiment.

And also a high operating speed is realized in the embodiment, without any high cost processing as a self-alignment process or a trench element separation process, since values of incidental capacitances of MOS transistors are equivalent to those of a bipolar transistor materialized by the self-alignment process and the trench element separation process, and cutoff frequency of MOS transistor is sufficiently high.

Furthermore, in a BiCMOS logic gate of an embodiment of the present invention, a dynamic range of said output complementary logic signal is arranged to be not smaller than a dynamic range of said input complementary logic signal and not larger than two times of said dynamic range of said input complementary logic signal.

So, speed reduction caused by slow response of bipolar transistors of high mutual conductance is also eliminated in the embodiment.

Still more, a BiCMOS logic gate of an embodiment of the present invention is designed to have each fixed value predetermined for a logic voltage swing, a voltage level of logic HIGH and a voltage level of logic LOW of said input complementary logic signals.

Therefore, with MOS transistors of low gate-drain voltage in addition to extremely low source-drain voltage, a BiC- MOS logic gate with a low power supply voltage is provided in the embodiment, which can be cascaded with little increase of the power supply voltage. And by applying depletion type MOS transistors, the power supply voltage can be still reduced.

And so, with MOS transistors free of speed down caused by an excessive amplitude of an input signal, a BiCMOS logic gate of the embodiment can be practically combinated with other type logic gates including a logic gate needing a low power supply for avoiding deterioration caused by hot electrons without any additional power supply, providing a high applicability.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

In connection with the drawings, embodiments of the present invention will be described in the following paragraphs.

Figure 1:
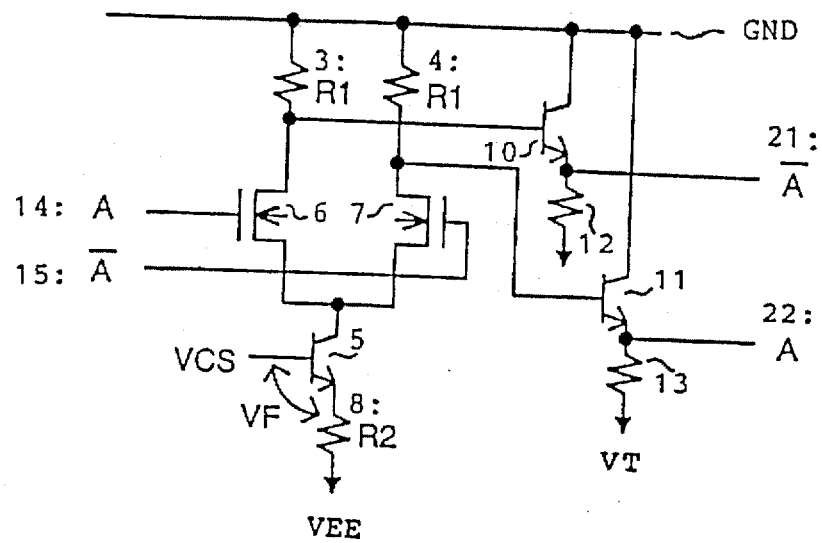
FIG. 1 illustrates a circuit diagram of a BiCMOS logic gate, a buffer/inverter, of an embodiment of the invention.

FIG. 1 illustrates a circuit diagram of a BiCMOS logic gate, a buffer/inverter, of an embodiment of the invention.

The buffer/inverter of FIG. 1 comprises;
a pair of differentially operating transistors consisting of a first and a second nMOS transistors 6 and 7 with their sources coupled with each other and their gates connected to input terminals 14 and 15 respectively, a first and a second resistors 3 and 4 connected between a positive power supply GND and drains of the first and the second nMOS transistors 6 and 7 respectively, a first NPN transistor 5 with its collector connected to sources of the first and the second nMOS transistors 6 and 7, its base connected to a constant voltage supply VCS and its emitter connected to a negative power supply VEE through a third resistor 8, a second NPN transistor 10 with its collector connected to the positive power supply GND, its emitter connected to a first output terminal 21 and its base connected to drain of the first nMOS transistor 6, a fourth resistor 12 connected between the first output terminal 21 and an termination power supply VT, a third NPN transistor 11 with its collector connected to the positive power supply GND, its emitter connected to a second output terminal 22 and its base connected to drain of the second nMOS transistor 7, and a fifth resistor 13 connected between the second output terminal 22 and the termination power supply VT.

Now, operations of the buffer/inverter of FIG. 1 are described.

When complementary logic signals are input to gates of the first and the second nMOS transistors 6 and 7, the first nMOS transistor 6, e.g., becomes ON gated with a signal relatively high and the second nMOS transistor 7 becomes OFF gated with the other signal relatively low. Here, gate width of the first and the second nMOS transistors 6 and 7 is assumed to be designed so as to give a sufficient current difference between ON/OFF statuses when controlled by an input logic signal amplitude.

Drain current intensity of the first nMOS transistor 6 is equal to intensity of its constant current source when it is ON. So, drain potential of the first nMOS transistor 6 drops from GND potential by a product of a resistance R2 of the first resistor 3 multiplied by a current intensity Ics of the constant current source.

On the other hand, drain potential of the second nMOS transistor 7, which becomes OFF, is equilibrated with the GND potential.

Defining the GND potential as 0V, higher level Voh of the output logic signals output from the emitter followers is given by a following equation $$Voh = -Vf, \quad (5)$$

while lower level Vol is expressed as $$Vol = -Vf - R1 \cdot Ics, \quad (6)$$

where $$Ics = (Vcs - Vf)/R2 \quad (7)$$

since voltage difference between both ends of the third resistor 8 equals a reference voltage difference Vcs between the constant voltage supply VCS and the negative power supply VEE diminished of a forward base-emitter bias Vf.

From the equations (5), (6) and (7), a following equation is obtained.

$$Vol = -Vf - (Vcs - Vf) \cdot R1/R2 \quad (8)$$

Therefore, output voltage swing Vswing is expressed as follows from the equations (5) and (8).

$$Vswing = (Vcs - Vf) \cdot R1/R2 \quad (9)$$

By supplying a constant voltage obtained from a band gap reference circuit based on the negative power supply VEE to the constant voltage supply VCS, value of Vcs−Vf can be maintained always constant, independent of temperature change or power supply fluctuation.

As for a value of the resistance ratio R1/R2, it can be also maintained constant, independent of absolute resistance deviation of each resistor caused through fabrication processes when the first and second resistors 3, 4 and the third resistor 8 are prepared with what is called digital resistors consisting of desired combinations of kinds of reference resistors.

Thus, a BiCMOS logic gate extremely stable against the power supply fluctuation, the temperature change and the fabrication process deviation is provided in the embodiment, wherein output swing voltage Vswing is determined by the resistance ratio R1/R2, the constant voltage supply VCS and the forward base-emitter bias Vf similarly as in an ECL gate.

Now, factors determining operating speed of the BiCMOS logic gate is considered.

Figure 2:
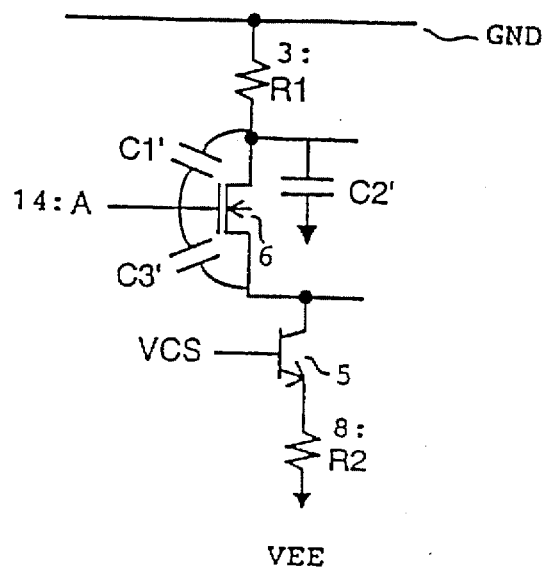
FIG. 2 illustrates incidental capacitances in a BiCMOS logic gate of the embodiment.

FIG. 2 illustrates incidental capacitances in a BiCMOS logic gate of the embodiment, wherein C1', C2' and C3' indicate an overlap capacitance between gate-drain, a drain capacitance to a substrate and an overlap capacitance between gate-source respectively. When the first nMOS transistor 6 becomes ON with its gate potential turning to HIGH, its drain potential drops and capacitances C1', C2' and C3' are charged or discharged.

Each potential of both electrodes of the gate-drain overlap capacitance C1' are shifted to opposite side, and so, C1' is about two times as affecting as other capacitances. But here, the gate-drain overlay, capacitance C1' is fairly small in MOS transistors. In a nMOS transistor of 0.4 µm gate length by 20 µm gate width, capacitances of C1', C2' and C3' are about 4.5 fF, 8.5 fF and 4.5 fF respectively. These values are equivalent to those of a NPN transistor materialized by a self-alignment process. Cutoff frequency fr of a 0.5 µm processed nMOS transistor exceeds 10 GHz.

Figure 3:
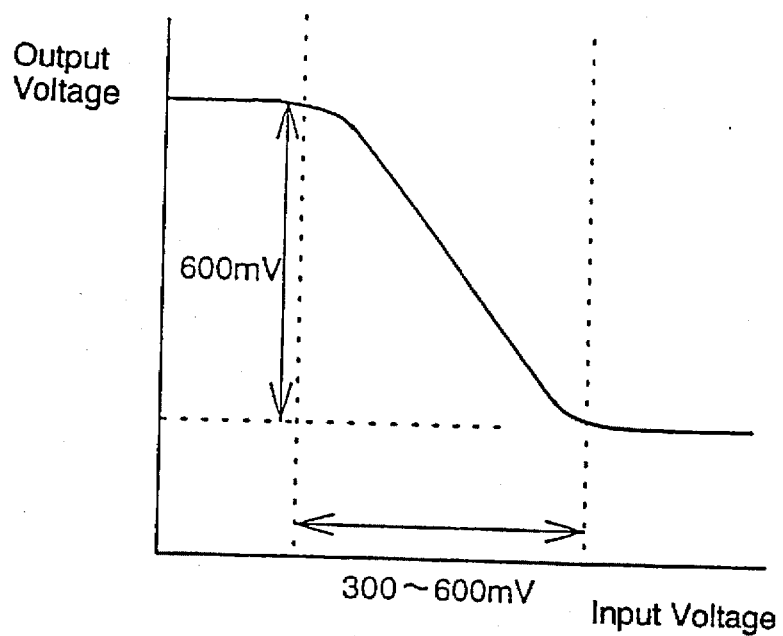
FIG. 3 shows in-out transfer characteristic of a BiCMOS logic gate of the embodiment.

In-out transfer characteristic of a BiCMOS logic gate of the embodiment is shown in FIG. 3.

MOS transistors, used for differential pairs of the BiCMOS logic gate of the embodiment, have smaller mutual conductance gm compared with bipolar transistors, resulting in a small difference between an input dynamic range and an output dynamic range. So, the first and the second nMOS transistors 6 and 7 follows immediately to an input signal swing and a charge or a discharge of each drain begins at once.

With a wider gate width of the nMOS transistors 6, 7, a higher voltage gain is obtained to an input signal swing, but the response of the nMOS transistors 6, 7 becomes slower and, in addition, operating speed falls down because of increase in the incidental capacitances C1', C2' and C3' of the nMOS transistors 6, 7.

Therefore, in BiCMOS logic gates of the embodiment, input dynamic range is preferable to be designed more than ½ of the output dynamic range.

Delay time of the buffer/inverter is measured by means of a circuit simulator, SPICE, using a 0.5 µm BiCMOS process as the device parameter, and a considerably good result of 40 ps is obtained on condition with no load capacitance. Here, the nMOS transistors are assumed to have a gate width of 20 µm and to be driven with a constant current source of 0.4 µA and a power supply of 3.3V.

Now, conditions necessary for designing a large scale integrated logic circuit consisting of the BiCMOS logic gate of the embodiment are described.

Figure 4:
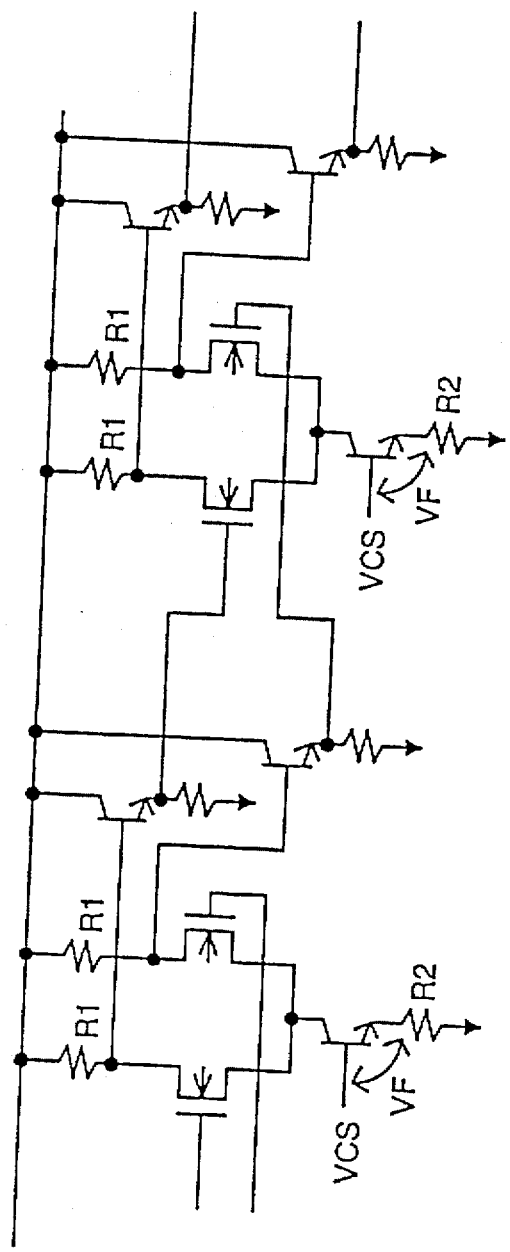
FIG. 4 shows an example of a series connection of the buffer/inverters of FIG. 1.

An example of a series connection of the buffer/inverters of FIG. 1 is illustrated in FIG. 4.

A condition for an input logic signal to pass at high speed with no swing voltage attenuation through each BiCMOS logic gate is that each logic gate of the embodiment has input and output signals of a same voltage swing and is designed to operate with a small logic voltage swing.

That is to say, voltage gain of the BiCMOS logic gate as a differential amplifier should be not smaller than 1, namely, the input dynamic range should be smaller than the output dynamic range. And in addition, product of the constant current source multiplied by the resistance of the first or the second resistor 3 or 4 in FIG. 1, which determines the logic voltage swing, must be sufficiently smaller than the power supply voltage.

In BiCMOS logic gates of the embodiment, circuit components, designed for a gate equipped with emitter followers on accordance with the condition described, can be also used for a gate without emitter follower satisfying the condition. This is a certain merit for designing a transistor size for a semiconductor integrated circuit of a master slice method which realizes a desired logic by only a wiring process with standardized transistors prepared on a semiconductor substrate.

Figure 5:
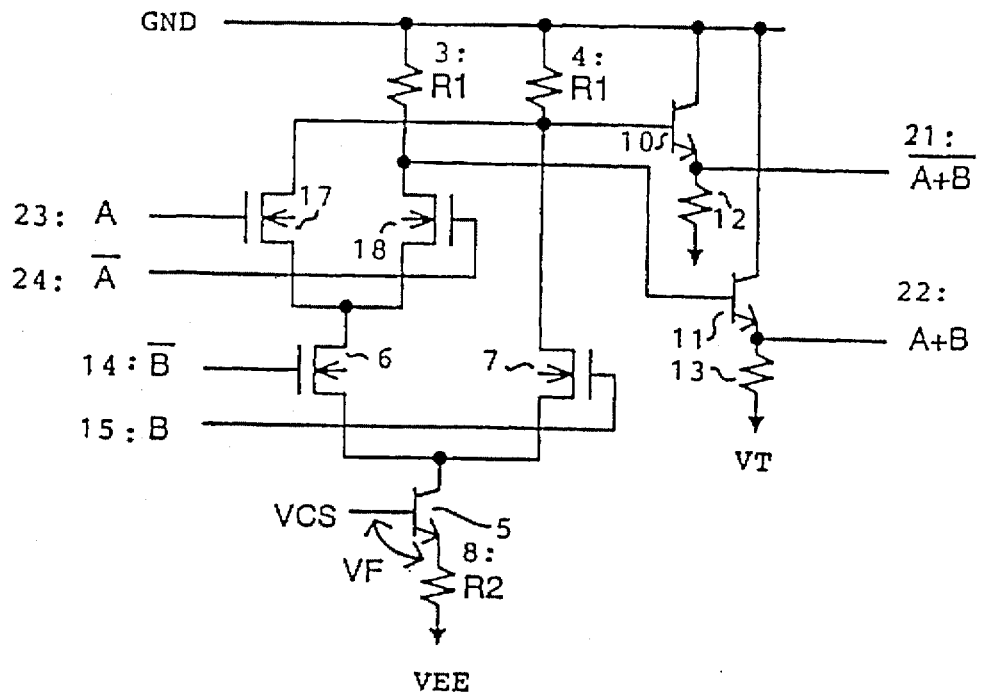
FIG. 5 is a circuit diagram of a two input OR/NOR gate wherein. BiCMOS logic gates of the embodiment are applied.

FIG. 5 is a circuit diagram of a two input OR/NOR gate wherein BiCMOS logic gates of the embodiment are applied.

Since nMOS transistors, having low mutual conductance gm compared with bipolar transistors, are used as switching elements in the BiCMOS logic gate of the embodiment, complementary signals are better to be used for the logic signals. Therefore, OR/NOR gate of nMOS transistors can not be realized by connecting their sources and drains parallel as provided in conventional ECL gates or CML gates.

OR/NOR logic with BiCMOS logic gates of the embodiment is provided with their cascade connection as shown in an example of FIG. 5. Cascade connection of MOS transistors can be applied widely because of their characteristics that the threshold voltages can be reduced and the operating speed does not sharply slow down with saturation, compared with bipolar transistors.

Referring to FIG. 5, further to the buffer/inverter of FIG. 1, there are comprised a differential pair of a third and a fourth nMOS transistors 17 and 18 with their sources both connected to drain of the first nMOS transistor 6, their gates connected to bases of the second and the third NPN transistors 10 and 11 respectively and their gates connected to a third and a fourth input terminals 23 and 24 respectively.

Now, operation of the OR/NOR gate of FIG. 5 is described.

Each of first complementary logic signals input to the third and the fourth input terminals 23 and 24 is denoted by A and $\overline{A}$, respectively, and each of second complementary signals input to the first and the second input terminals is denoted by B and $\overline{B}$, respectively.

It is only when both the first and the third nMOS transistors 6 and 17 become ON that an output signal logic at the second output terminal 22 is turned to LOW by a potential drop generated by current flowing through the first resistor 3. It is when both $\overline{A}$ and $\overline{B}$ are at logic HIGH, namely, both A and B are at logic LOW. Thus, OR logic of A and B is obtained from the second output terminal 22.

Output logic of the first output terminal 21 becomes HIGH when there is no current flowing through the second resistor 4, that is when series path of the first and the third nMOS transistors 6 and 17 is cut besides the second nMOS transistor is OFF. For the second nMOS transistor 7 being OFF, B should be at logic LOW and the first nMOS transistor 6 should be gated to ON by $\overline{B}$ at logic HIGH. So, the third nMOS transistor 17 should be gated OFF by A at logic LOW. Thus, output logic at the first output terminal 21 represents NOR logic of A and B, that is AND logic of $\overline{A}$ and $\overline{B}$.

Output voltage swing of the OR/NOR gate of FIG. 5 is determined by the resistance ratio R1/R2 and the reference voltage difference Vcs obtained from a band gap reference circuit as described in connection with the buffer/inverter of FIG. 1, resulting a sufficient operational stability independent of characteristic deviation of MOS transistors.

Figure 6:
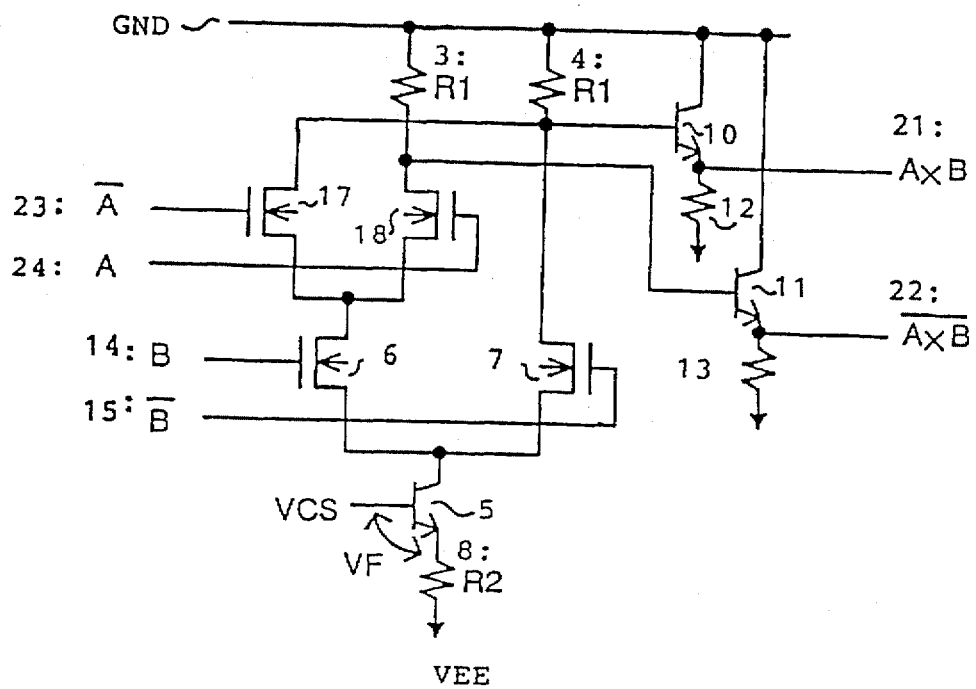
FIG. 6 is a circuit diagram of a two input AND/NAND gate wherein BiCMOS logic gates of the embodiment are applied.

Referring to FIG. 6, an AND/NAND gate consisting of BiCMOS logic gates of the embodiment is described.

It has just the same configuration with the OR/NOR gate of FIG. 5.

Here, in the AND/NAND gate of FIG. 6, the inverted logic $\overline{A}$ of first input complementary logic signals is input to the third input terminal 23 instead of the un-inverted logic A, which is input in turn to the fourth input terminal 24. Similarly, the second complementary logic signals B and $\overline{B}$ are input to the first and the second input terminals 14 and 15 of the AND/NAND gate of FIG. 6, respectively.

Therefore, output logic of the first output terminal 21 is NOR logic of $\overline{A}$ and $\overline{B}$ as described in connection with FIG. 5, that is, AND logic of A and B, while OR logic of $\overline{A}$ and $\overline{B}$, that is NAND logic of A and B is obtained from the second output terminal 22, with a sufficient operational stability independent of characteristic deviation of MOS transistors.

Figure 7:
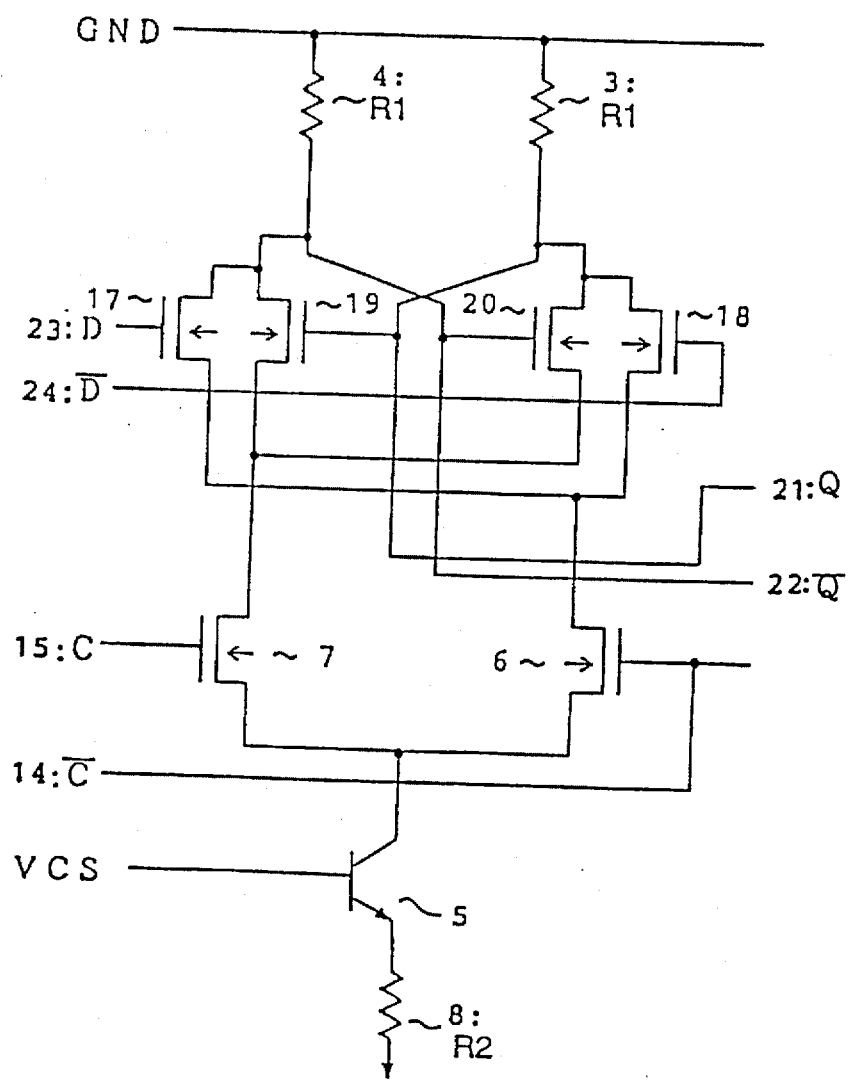
FIG. 7 is a circuit diagram of a latch circuit wherein BiCMOS logic gates of the embodiment are applied.

FIG. 7 illustrates a circuit diagram of a latch circuit wherein BiCMOS logic gates of the embodiment are applied.

Configuration of the latch circuit of FIG. 7 comprises a differential pair of a fifth and a sixth nMOS transistors 19 and 20 inserted between drain of the second nMOS transistor 7 and the second resistor 4, in addition to the circuit configuration of the BiCMOS logic gate described in connection with FIG. 5 or FIG. 6 without pair of emitter followers comprising the second and the third NPN transistors 10 and 11.

Both sources of the fifth and the sixth nMOS transistors 19 and 20 are connected to drain of the second nMOS transistor 7. Drain of the fifth nMOS transistor 19 is connected to the second resistor 4 together with drain of the third nMOS transistor 17 and further connected to gate of the sixth nMOS transistor 20 and the first output terminal 21, and similarly, drain of the sixth nMOS transistor 20 is connected to the second resistor 3 together with drain of the fourth nMOS transistor 18 and further connected to gate of the fifth nMOS transistor 19 and the second output terminal 22.

Complementary logic signals denoted by D and $\overline{D}$ are input to the third and the fourth input terminals 23 and 24 respectively and a clock signal C and its inverted signal $\overline{C}$ are supplied to the second and the first input terminals 15 and 14 of the latch circuit, respectively, for obtaining output complementary logic signals Q and $\overline{Q}$ from the first and the second output terminals 21 and 22, respectively.

Input logic signals D, $\overline{D}$ and clock signals C, $\overline{C}$ may have a same swing voltage, that is same potentials for logic HIGH and logic LOW, −0.9V and −1.5V for example.

When the clock signal C turns to logic LOW on condition that the input signal D remains at logic HIGH, the first and the third nMOS transistors 6 and 17 being ON, a potential drop is generated by the second resistor 4 and the sixth nMOS transistor 20 becomes OFF gated thereby. The fourth nMOS transistor 18 also being OFF controlled by the inverted input signal $\overline{D}$, drains of the fourth and the sixth nMOS transistors are charged to potential of the positive power supply GND.

The second nMOS transistor 7, which has charged sources of the fifth and the sixth nMOS transistors 19 and 20, is turned to OFF gated by the clock signal C.

Then, the clock signal C returning to logic HIGH, the second nMOS transistor 7 becomes ON in turn of the first nMOS transistor 6 becoming OFF. Since the fifth nMOS transistor 19 remains ON, gated by drains of the fourth and the sixth nMOS transistors 18, 20 charged to potential of the positive power supply GND, output signals of the latch circuit remain unchanged.

Even when the input signal D is shifted to logic LOW, output signals of the latch circuit do not change since the third and the fourth nMOS transistors 17 and 18 receiving both of the complementary logic signals D and $\overline{D}$, are connected to the first nMOS transistor 6 on status OFF gated by logic LOW of the inverted clock signal $\overline{C}$. Thus, input complementary logic signals are latched by a falling edge of the clock signal C.

Figure 8:
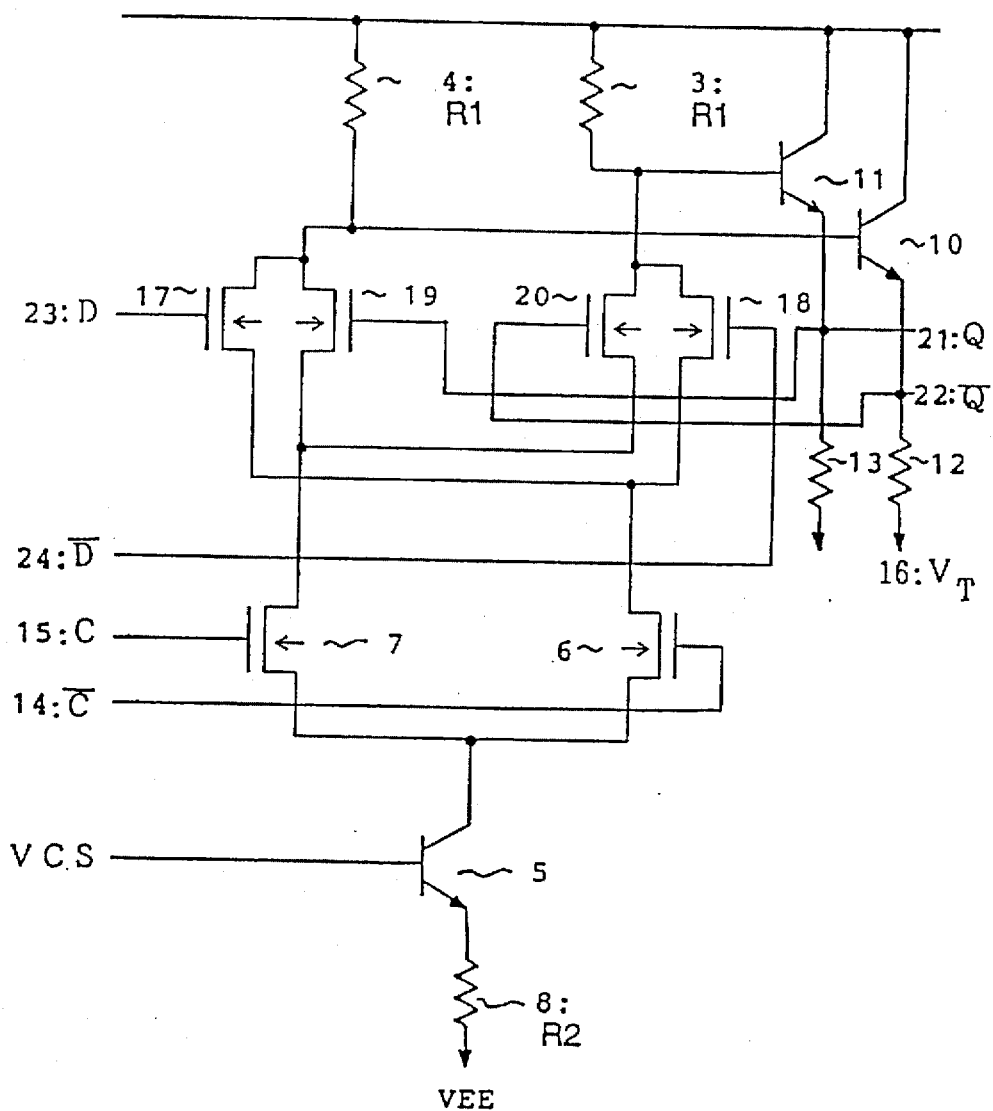
FIG. 8 is a circuit diagram of another latch circuit wherein BiCMOS logic gates of the embodiment are applied.

FIG. 8 illustrates another latch circuit wherein BiCMOS logic gates of the embodiment are applied, having a pair of emitter followers comprising the second and the third NPN transistors 10 and 11 of FIG. 1. In the latch circuit of FIG. 8, gate of each of the fifth and the sixth nMOS transistors 19 and 20 is gated by output of each of the pair of emitter followers controlled by drain potential of each other of the fifth and the sixth nMOS transistors 19 and 20, providing a latch circuit more stable and faster than the latch circuit of FIG. 7, since the third and the fourth nMOS transistors 17, 18 of succeeding gate are controlled by the signal voltage levels generated by the pair of emitter followers.

Figure 9:
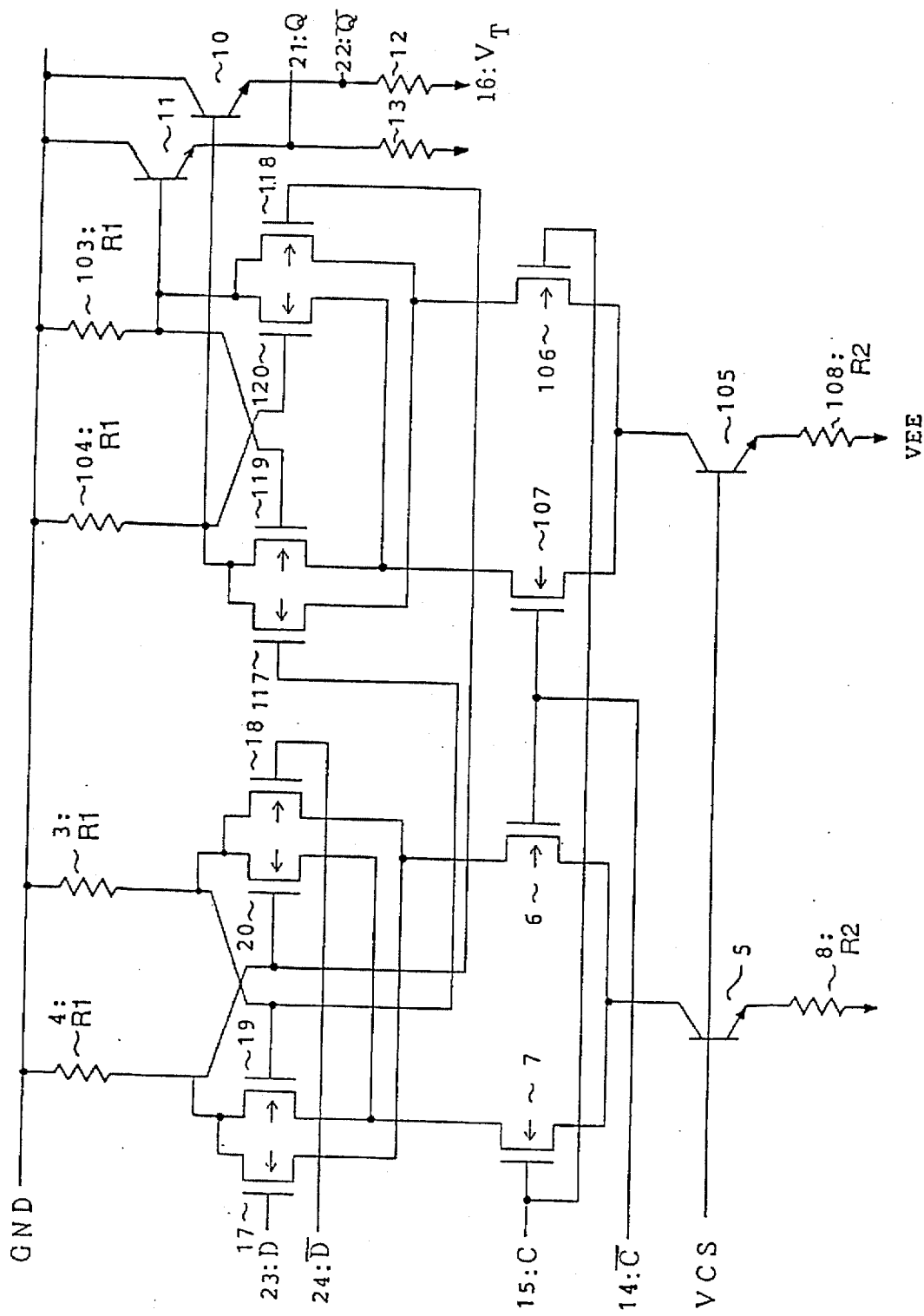
FIG. 9 is a circuit diagram of a flipflop wherein BiCMOS logic gates of the embodiment are applied.

FIG. 9 is a circuit diagram of a master-slave type flip flop consisting of two latch circuits of FIG. 7, a master latch receiving input complementary logic signals and a slave latch supplied with output complementary logic signal of the master latch and a pair of emitter followers. The master and the slave latch have a same circuit configuration with the latch circuit of FIG. 7 and each component of the slave latch is indicated by a numeral of each corresponds component of the master latch added with 100 here in FIG. 9, duplicated descriptions being omitted. In the slave latch, gates of a third and a fourth nMOS transistors 117 and 118 are controlled by potential drops generated by the first and the second resistors 3 and 4 of the master latch, respectively, and potential drops generated by a first and a second resistor 103 and 104 control the emitter followers driving the first and the second output terminals 21 and 22, respectively.

The master latch latches input complementary logic signals by a falling edge of the clock signal C as described in connection with FIG. 7.

As for the slave latch, a first nMOS transistor 106 becomes ON when the clock signal C turns to logic HIGH and one, the nMOS transistor 117 for example, of the third and the fourth nMOS transistors 117 and 118 of the slave latch becomes ON according to the output complementary logic signals of the master latch, the other of them turning to OFF.

In turn of the first nMOS transistor 106, the second nMOS transistor 107 turns to OFF controlled by logic LOW of the inverse clock signal $\overline{C}$ and cuts sources of a fifth and a sixth nMOS transistors 119 and 120. Therefore, complementary logic signals of logic HIGH and logic LOW, which are the same as logic latched by the master latch at the falling edge just before of the clock signal C, are output from the first and the second output terminals 21 and 22, respectively, in the case.

At next falling edge of the clock signal C, the master latch latches new status of the input complementary logic signals when they are changed, while the slave latch retaining its status independent of the master latch status inactivated by logic LOW of the clock signal C.

When the clock signal C turns to logic HIGH, the slave latch latches the new status of the master latch, revising the output complementary logic signals of the first and the second output terminals 21 and 22.

In this way, a flipflop logic is realized by the circuit of FIG. 9, which latches input data at a falling edge of a clock signal, outputting the input data after a following rising edge of the clock signal, retaining the input data until a next rising edge of the clock signal.

Output voltage swing is determined by the reference potential difference Vcs, the forward base-emitter bias Vf and the resistance ratio R1/R2 as same as the other applications of the embodiment, resulting a rigid stability independent of processing deviation, power supply fluctuation or temperature change.

And, it is apparent that a more stable and faster master-slave type flipflop can be provided by applying the latch circuit of FIG. 8 to each latch of the flipflop.

Now, a minimum power supply voltage necessary for a BiCMOS logic gate of the embodiment is considered.

Potentials of logic HIGH and logic LOW of an output logic signal of a preceding gate should differentiate statuses ON and OFF of a pair of nMOS transistors.

Drain current Id of a differential pair of nMOS transistors is given by a following equation (10) and becomes the larger when the smaller becomes the threshold voltage Vth in a gate-source voltage difference Vgs.

$$Id = K(Vgs - Vth)^2 W/L, \quad (10)$$

where, K is a coefficient peculiar to a device and W and L are a gate width and a gate length.

Therefore, defining GND potential as 0V, potential of coupled sources of a differential pair of nMOS transistors equals potential preceding emitter follower at logic HIGH, −0.9V in the case, minus basic gate-source voltage Vgs.

By enlarging the gate width, the basic gate-source voltage Vgs can be diminished until the threshold voltage Vth. So, a minimum necessary power supply voltage is given by a following equation (11) assuming the necessary voltage for the constant current source as 0.6V, which is the same value with the conventional ECL gate beforehand described.

$$0.9 + 0.6V + Vth = 1.5V + Vth \quad (11)$$

Therefore, the minimum necessary power supply voltage can be deminished with diminution of the threshold voltage Vth on condition the gate width is sufficiently wide.

Having no such phenomenon corresponding a sharp fall down of operating speed observed in a saturated bipolar transistor, MOS transistors can be designed with fairly small source-drain voltage. Furthermore, with MOS transistors thus designed, cascaded differential pairs of MOS transistors in AND/OR gates need not input logic signals of different levels prepared for each stage of the cascade, and so, power supply voltage inceases hardly by a cascade, providing an appropriate gate width.

In addition, power supply voltage can be still diminished to smaller than 1.5V of the equation (11) by applying depletion type MOS transistors.

Still further in the BiCMOS logic gate of the embodiment, no circuit as a level shift circuit is needed since voltage regulation of input signals is not necessary for preventing saturation of each differential pair of transistors which is indispensable for conventional bipolar ECL or CML gates.

Figure 10:
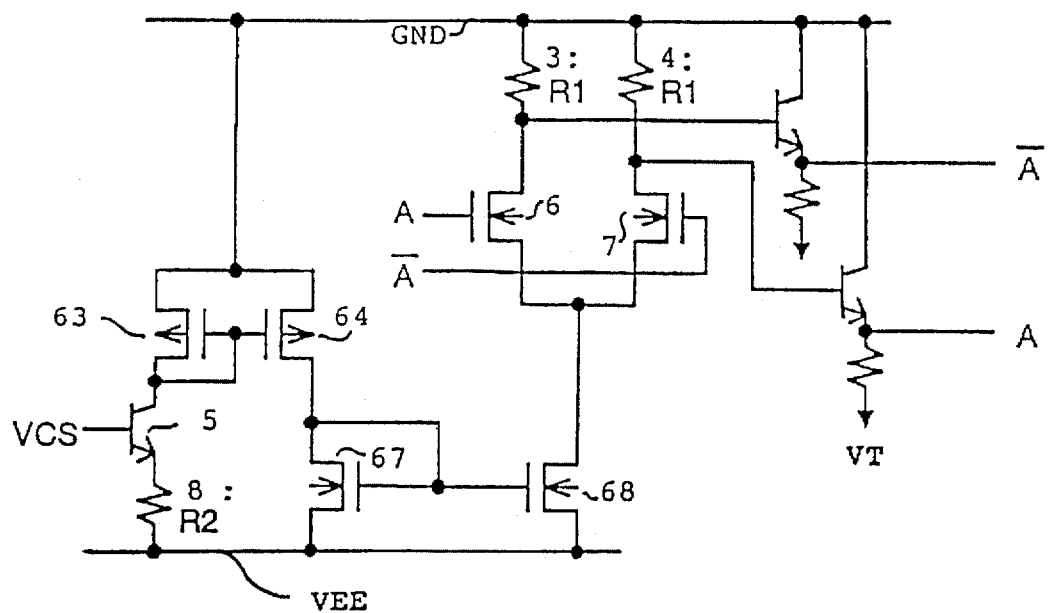
FIG. 10 illustrates a buffer/inverter of a BiCMOS logic gate having another configuration.

In the following paragraphs, another embodiment of the invention will be described referring to FIG. 10 illustrating a buffer/inverter of a BiCMOS logic gate having another configuration.

In FIG. 10, a first current mirror consisting of a first and a second pMOS transistors 63 and 64 and a second current mirror consisting of a seventh and a eighth nMOS transistors 67 and 68 are comprised in addition to the circuit configuration of the BiCMOS logic gate of FIG. 1.

The constant current supplied from collector of the first NPN transistor 5 is supplied as input current to the first current mirror in FIG. 10. Output current of the first current mirror is supplied as input current to the second current mirror and output current thereof is supplied to the coupled sources of the differential pair of the first and the second nMOS transistors 6 and 7 in the embodiment of FIG. 10.

Thus, a still smaller power supply voltage can be realized in the second embodiment than the first embodiment beforehand described, since there is nothing but a nMOS transistor between sources of a differential pair of nMOS transistors and the negative power supply VEE.

As same as in the first embodiment, output voltage swing of the logic gate is determined by the reference voltage difference Vcs and the resistance ratio R1/R2, resulting a rigid stability independent of processing deviation, power supply fluctuation or change in the second embodiment, too. It goes without saying that the constant current source of the second embodiment can be applied in the other applications described in connection with the first embodiment and the seventh and the eighth nMOS transistors 67 and 68 may be substituted with NPN transistors.

Figure 11:
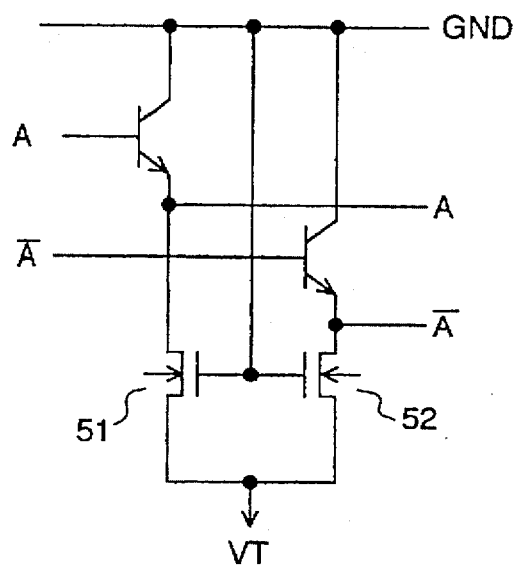
FIG. 11(A) illustrates a pair of emitter followers comprising nMOS transistors.
FIG. 11(B) illustrates another pair of emitter followers comprising nMOS transistors.
Figure 11:
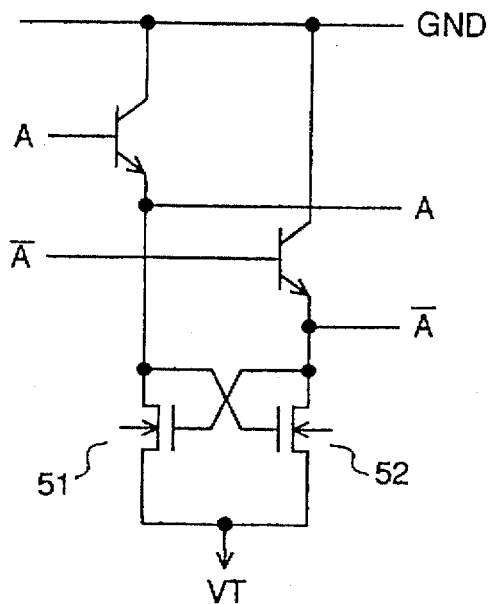
Figure 12:
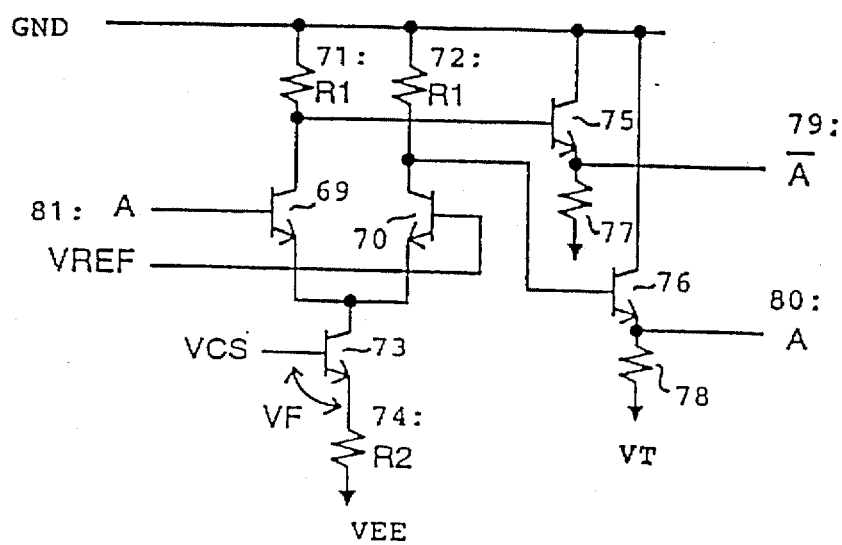
FIG. 12 is a circuit diagram of a buffer/inverter of a conventional ECL gate.
Figure 13:
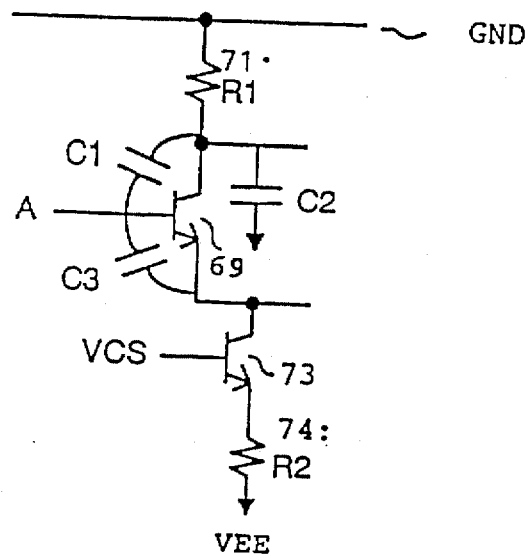
FIG. 13 illustrates equivalent capacitances incidental to each node of the ECL gate.
Figure 14:
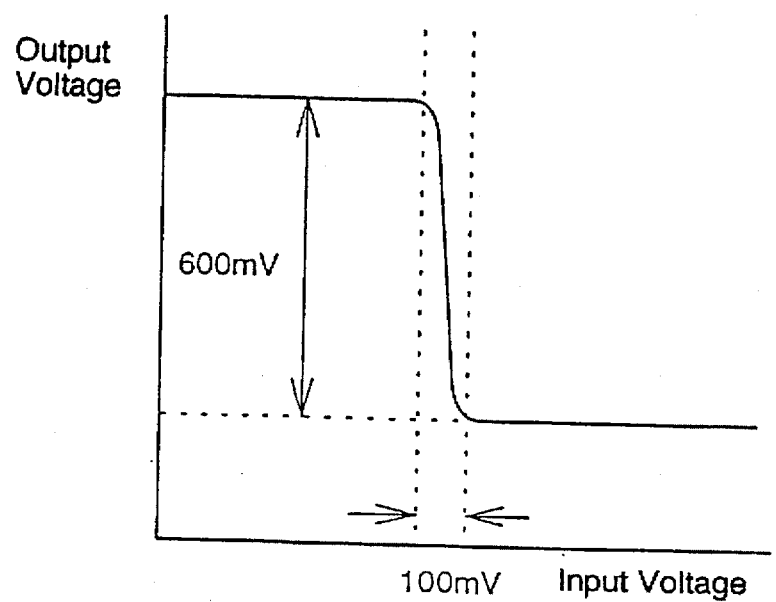
FIG. 14 shows in-out transfer characteristic of the ECL gate.
Figure 15:
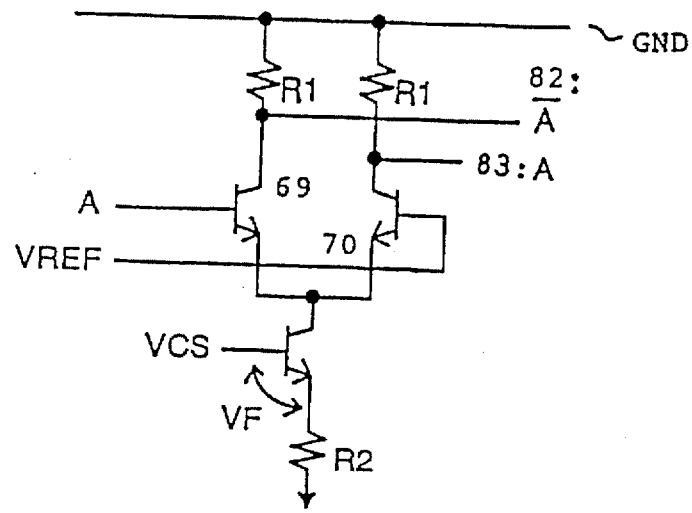
FIG. 15 is a circuit diagram of a conventional CML gate.
Figure 16:
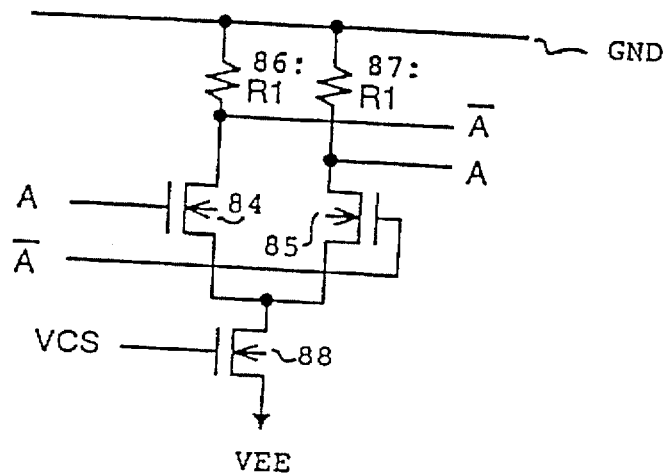
FIG. 16 illustrates a conventional MCML gate.

In the embodiments heretofore described, emitter followers having a resistor as their load discharging element are applied, but the load discharging elements can be substituted by nMOS transistors with their gates connected to the positive power supply GND as shown in FIG. 11(A) or to the other output terminal of the output terminal concerned as shown in FIG. 11(B). In the case, larger discharging current of falling output signal can be obtained by using nMOS transistors in their saturation region, realizing a still faster BiCMOS logic gate.

As heretofore described, BiCMOS logic gates of the embodiments can be applied in various logic gates by arranging a desired combination of differential pairs of nMOS transistors.

Furthermore, with a combination of BiCMOS logic gates of the embodiments having their own constant surrent sources, a still complexed BiCMOS logic gate provided with different constant current sources can be materialized.

Still further, by applying appropriate level convertors when necessary, BiCMOS logic gates can be combined with other conventional logic gates as a CMOS logic gate, a BiCMOS logic gate, a BiNMOS logic gate, an ECL gate, or a CML gate on a BiCMOS integrated semiconductor circuit with a common power supply, even with a logic gate needing a low power supply for avoiding deterioration caused by hot electrons.

And still further, BiCMOS logic gates of the embodiments having a differential pair of MOS transistors, which operate without speed decreased caused by a temporary diminution of their source-drain potential difference owing to an excessive input potential swing, can be connected directly to a conventional logic gate as a CMOS logic gate, BiCMOS logic gate or a BiNMOS logic gate.

Heretofore, some embodiments and concrete applications thereof are described but it should be conprehended that there are various embodiments that are within in the scope of the present invention.

What is claimed is:

1. A BiCMOS logic circuit operating as a gate comprising:

a pair of nMOS transistors, each source of said pair of nMOS transistors connected together, and each gate of said pair of nMOS transistors supplied with one of complementary logic input signals for controlling ON/OFF status of each of said pair of nMOS transistors;

a constant current source connected between the connection of said sources and a negative terminal of a power supply, said constant current source including a bipolar transistor with a base controlled by a reference voltage;

a pair of load elements each of said pair of load elements connected between the drain of a respective one of said pair of nMOS transistors and a positive terminal of said power supply, and each of said pair of load elements generating a respective voltage difference, the respective voltage differences being output as each of complementary logic output signals; and a pair of emitter followers, each of said pair of emitter followers having a NPN transistor with a base supplied with one of said complementary logic output signals, a collector connected to said positive terminal of said power supply, and an emitter connected through a load capacitance discharging means to a termination power supply, said termination power supply having a predetermined potential between potentials of said positive terminal and said negative terminal of said power supply.

2. The BiCMOS logic circuit operating as a gate recited in claim 1, wherein:

drain current intensity of one of said pair of nMOS transistors when in an ON status is determined by current intensity of said constant current source; and each of circuit constants of the BiCMOS logic gate, including said current intensity of said constant current source, a size of said pair of nMOS transistors, and a resistance of said pair of load elements is selected such that said voltage differences to be output as said complementary logic output signals have a voltage swing width the same as a voltage swing width of said complementary logic input signals.

3. The BiCMOS logic circuit recited in claim 1, characterized in that said load capacitance discharging means connected to an emitter of one of said pair of emitter followers consist of a nMOS transistor, a gate of said nMOS transistor connected to one of said positive terminal of said power supply and an emitter of the other of said pair of emitter followers.

4. The BiCMOS logic circuit recited in claim 2, characterized in that said load capacitance discharging means connected to an emitter of one of said pair of emitter followers consist of a nMOS transistor, a gate of said nMOS transistor connected to one of said positive terminal of said power supply and an emitter of the other of said pair of emitter followers.

5. A BiCMOS logic circuit operating as a gate comprising:

a first pair of nMOS transistors, each source of said first pair of nMOS transistors connected to each other, each gate of said first pair of nMOS transistors supplied with a respective one of first complementary logic input signals, and a first drain of said first pair of nMOS transistors connected to a positive terminal of a power supply through a first load element;

a second pair of nMOS transistors, each source of said second pair of nMOS transistors connected to each other and connected to a second drain of said first pair of nMOS transistors, each gate of said second pair of nMOS transistors supplied with a respective one of second complementary logic input signals, one drain of said second pair of nMOS transistors connected to said positive terminal of said power supply through said first load element and the other drain of said second pair of nMOS transistors connected to said positive terminal of said power supply through a second load element;

a constant current source connected between the connection of said sources of said first pair of nMOS transistors and a negative terminal of said power supply, said constant current source including a bipolar transistor with a base controlled by a reference voltage; and first and second output terminals connected to a respective one of said drains of said second pair of nMOS transistors for outputting voltage differences generated by said first and said second load elements, respectively, as complementary logic output signals.

6. A BiCMOS logic circuit operating as a latch circuit comprising:

a constant current source including a NPN bipolar transistor, a base of said NPN bipolar transistor controlled with a reference voltage, and an emitter of said NPN bipolar transistor connected to a negative terminal of a power supply through a resistor;

first and second nMOS transistors, sources of said first and said second nMOS transistors both connected to said constant current source, and gates of said first and said second nMOS transistors each being supplied with one of complementary clock signals;

a pair of nMOS transistors consisting of a third nMOS transistor and a fourth nMOS transistor, sources of said pair of nMOS transistors connected to a drain of said first nMOS transistor, and each gate of said third and said fourth nMOS transistors being supplied with one of complementary logic input signals;

fifth and sixth nMOS transistors with sources connected to a drain of said second nMOS transistor, the gate of said fifth transistor connected to a drain of said fourth transistor and the gate of said sixth transistor connected to a drain of said third nMOS transistor;

a pair of load elements, one of said pair of load elements connected between a positive terminal of said power supply and connected together drains of said third and said fifth nMOS transistors, and the other of said load elements connected between said positive terminal of said power supply and connected together drains of said fourth and said sixth nMOS transistors; and first and second output terminals, said first output terminal connected to said connected together drains of said third and said fifth nMOS transistors, and said second output terminal connected to said connected together drains of said fourth and said sixth nMOS transistors, said output terminals for outputting complementary logic output signals.

7. A BiCMOS logic circuit operating as master-slave type flipflop consisting of first and second BiCMOS latch circuits, each of said first and second BiCMOS latch circuits being a BiCMOS logic circuit operating as a latch circuit and comprising:

a constant current source including a NPN bipolar transistor, a base of said NPN bipolar transistor controlled with a reference voltage, and an emitter of said NPN bipolar transistor connected to a negative terminal of a power supply through a resistor;

first and second nMOS transistors, sources of said first and said second nMOS transistors both connected to said constant current source, and gates of said first and said second nMOS transistors each being supplied with one of complementary clock signals;

a pair of nMOS transistors consisting of a third nMOS transistor and a fourth nMOS transistor, sources of said pair of nMOS transistors connected to a drain of said first nMOS transistor, and each gate of said third and said fourth nMOS transistors being supplied with one of complementary logic input signals;

fifth and sixth nMOS transistors with sources connected to a drain of said second nMOS transistor, the gate of said fifth transistor connected to a drain of said fourth transistor and the gate of said sixth transistor connected to a drain of said third nMOS transistor;

a pair of load elements, one of said pair of load elements connected between a positive terminal of said power supply and connected together drains of said third and said fifth nMOS transistors, and the other of said load elements connected between said positive terminal of said power supply and connected together drains of said fourth and said sixth nMOS transistors; and first and second output terminals, said first output terminal connected to said connected together drains of said third and said fifth nMOS transistors, and said second output terminal connected to said connected together drains of said fourth and said sixth nMOS transistors, said output terminals for outputting complementary logic output signals;

wherein said first and said second output terminals of said first BiCMOS latch circuit are connected, respectively, to gates of said third and said fourth nMOS transistors of said second BiCMOS latch circuit.

8. A BiCMOS logic circuit operating as a latch circuit comprising:

a constant current source including a NPN bipolar transistor a base of said NPN bipolar transistor controlled with a reference voltage, and an emitter of said NPN bipolar transistor connected to a negative terminal of a power supply through a resistor;

first and second nMOS transistors, sources of said first and said second nMOS transistors both connected to said constant current source, and gates of said first and said second nMOS transistors being supplied with one of complementary clock signals;

a pair of nMOS transistors consisting of a third nMOS transistor and a fourth nMOS transistor, sources of said pair of nMOS transistors connected to a drain of said first nMOS transistor, and each gate of said third and said fourth nMOS transistors being supplied with one of complementary logic input signals;

a pair of emitter followers, each of said pair of emitter followers having a NPN transistor with a base connected with a drain of a respective one of said third and said fourth nMOS transistors, a collector connected to a positive terminal of said power supply, and an emitter connected through a respective load capacitance discharging means to a termination power supply having a predetermined potential which is between potentials of said positive terminal and said negative terminal of said power supply;

fifth and sixth nMOS transistors with sources connected to a drain of said second nMOS transistor, each gate of said fifth and said sixth nMOS transistors connected to a respective emitter of said NPN transistors of said emitter followers;

a pair of load elements, one of said pair of load elements connected between a positive terminal of said power supply and connected together drains of said third and said fifth nMOS transistors, and the other of said load element connected between said positive terminal of said power supply and connected together drains of said fourth and said sixth nMOS transistors; and first and second output terminals, said first output terminal connected to an emitter of said NPN transistor having a base connected with a drain of said fourth nMOS transistor, and said second output terminal connected to an emitter of said NPN transistor having a base connected with a drain of said third nMOS transistor, said first and second output terminals for outputting complementary logic output signals.

9. A BiCMOS logic circuit operating as master-slave type flipflop consisting of first and second BiCMOS latch circuits, each of said first and second BiCMOS latch circuits being a BiCMOS logic circuit operating as a latch circuit and comprising:

a constant current source including a NPN bipolar transistor, a base of said NPN bipolar transistor controlled with a reference voltage, and an emitter of said NPN bipolar transistor connected to a negative terminal of a power supply through a resistor;

first and second nMOS transistors, sources of said first and said second nMOS transistors both connected to said constant current source, and gates of said first and said second nMOS transistors being supplied with one of complementary clock signals;

a pair of nMOS transistors consisting of a third nMOS transistor and a fourth nMOS transistor, sources of said pair of nMOS transistors connected to a drain of said first nMOS transistor, and each gate of said third and said fourth nMOS transistors being supplied with one of complementary logic input signals;

a pair of emitter followers, each of said pair of emitter followers having a NPN transistor with a base connected with a drain of a respective one of said third and said fourth nMOS transistors, a collector connected to a positive terminal of said power supply, and an emitter connected through a respective load capacitance discharging means to a termination power supply having a predetermined potential which is between potentials of said positive terminal and said negative terminal of said power supply;

fifth and sixth nMOS transistors with sources connected to a drain of said second nMOS transistor, each gate of said fifth and said sixth nMOS transistors connected to a respective emitter of said NPN transistors of said emitter followers;

a pair of load elements, one of said pair of load elements connected between a positive terminal of said power supply and connected together drains of said third and said fifth nMOS transistors, and the other of said load elements connected between said positive terminal of said power supply and connected together drains of said fourth and said sixth nMOS transistors; and first and second output terminals, said first output terminal connected to an emitter of said NPN transistor having a base connected with a drain of said fourth nMOS transistor, and said second output terminal connected to an emitter of said NPN transistor having a base connected with a drain of said third nMOS transistor, said first and second output terminals for outputting complementary logic output signals;

wherein said first and said second output terminals of said first BiCMOS latch circuit being connected, respectively, to gates of said third and said fourth nMOS transistors of said second BiCMOS latch circuit.

10. The BiCMOS logic gate recited in one of claims 2, 5, and 1, wherein each of said load elements consists of a combination of reference resistors prepared in the same kind of fabrication process.

11. The BiCMOS logic circuit recited in one of claim 5 to claim 7, further comprising a pair of emitter followers, each of said pair of emitter followers having a NPN transistor with a base supplied with one of said complementary logic output signals, a collector connected to said positive terminal of said power supply, and an emitter connected through a respective load capacitance discharging means to a termination power supply having a predetermined potential which is between potentials of said positive terminal and said negative terminal of said power supply.

12. The BiCMOS logic circuit recited in claim 11, wherein each of said respective load capacitance discharging means connected to an emitter of the NPN transistor of one of said pair of emitter followers comprises:

a nMOS transistor, a gate of said nMOS transistor connected to one of said positive terminal of said power supply and an emitter of the NPN transistor of the other of said pair of emitter followers.

13. The BiCMOS logic circuit recited in one of claim 8 and claim 9, wherein each of said respective load capacitance discharging means connected to said emitter of said NPN transistor of one of said pair of emitter followers comprises:

a nMOS transistor, a gate of said nMOS transistor connected to one of said positive terminal of said power supply and an emitter of the NPN transistor of the other of said pair of emitter followers.

14. The BiCMOS logic gate recited in one of claims 6 through 9, wherein each of said load elements and said resistor consists of a combination of reference resistors prepared via the same kind of fabrication process.

15. The BiCMOS logic circuit recited in one of claims 5 through 9 or 1 or 2, wherein at least one pair of said nMOS transistors comprised in said BiCMOS logic circuit consists of depletion type nMOS transistors.

16. The BiCMOS logic, circuit recited in one of claims 5 through 9 or 1 or 2, wherein a dynamic range of said complementary logic output signal is not smaller than a dynamic range of said complementary logic input signal and not larger than two times of said dynamic range of said complementary logic input signal.

17. The BiCMOS logic circuit recited in one of claims 5 through 9 or 1, wherein a logic voltage swing of said complementary logic output signal is predetermined by selection of fixed values of quantities selected from the group consisting of: a current intensity of said constant current source, a size of a pair of said nMOS transistors, a resistance of said pair of load elements, and combinations thereof.

18. The BiCMOS logic circuit recited in one of claims 5 through 9 or 1 or 2, in combination with, sharing a common power supply with, and being on a common substrate with at least one circuit of a type selected from the group consisting of: CMOS logic gates, BiCMOS logic gates, and BiNMOS logic gates.

19. The BiCMOS logic circuit recited in one of claims 5 through 9 or 1 or 2, connected directly with a circuit of a type selected from the group consisting of: CMOS logic gates, BiCMOS logic gates and BiNMOS logic gates.

20. The BiCMOS logic circuit recited in one of claims 2, 5, and 1, wherein said constant current source comprises a current mirror circuit.

* * * * *